United States Patent [19]

Raj

[11] Patent Number: 5,173,354

[45] Date of Patent: Dec. 22, 1992

[54] NON-BEADING, THIN-FILM, METAL-COATED CERAMIC SUBSTRATE

[75] Inventor: Rishi Raj, Ithaca, N.Y.

[73] Assignee: Cornell Research Foundation, Inc., Ithaca, N.Y.

[21] Appl. No.: 626,696

[22] Filed: Dec. 13, 1990

[51] Int. Cl.$^5$ .................. B32B 15/04; B32B 15/20
[52] U.S. Cl. .................. 428/209; 428/210; 428/336; 428/432; 428/433; 428/434; 428/457; 428/469; 428/472; 428/697; 428/901
[58] Field of Search .......... 428/209, 210, 336, 426, 428/432, 433, 434, 457, 469, 472, 697, 901

[56] References Cited

U.S. PATENT DOCUMENTS

| | | | |
|---|---|---|---|
| 3,197,290 | 7/1965 | Williams | 428/633 |
| 3,657,003 | 4/1972 | Kenney | 427/430.1 |
| 3,753,774 | 8/1973 | Velorle | 117/212 |
| 3,837,894 | 9/1974 | Tucker, Jr. | 428/432 |
| 3,940,531 | 2/1976 | Demarest, Jr. | 428/434 |
| 3,944,696 | 3/1976 | Larry | 428/901 |
| 3,979,187 | 9/1976 | Scherer | 228/122 |
| 4,050,956 | 9/1977 | de Bruin et al. | 428/434 |
| 4,109,031 | 8/1978 | Marscher | 428/556 |
| 4,154,874 | 5/1979 | Howard et al. | 427/91 |
| 4,201,577 | 5/1980 | Ingersoll et al. | 420/587 |
| 4,252,862 | 2/1981 | Nishida | 428/457 |
| 4,255,291 | 3/1981 | Needes et al. | 428/901 |
| 4,281,041 | 7/1981 | Koehler | 428/336 |
| 4,470,537 | 9/1984 | Diem et al. | 228/193 |
| 4,491,622 | 1/1985 | Batt | 428/432 |
| 4,535,029 | 8/1985 | Intrater et al. | 428/469 |
| 4,542,073 | 9/1985 | Tanaka et al. | 428/446 |
| 4,594,137 | 6/1986 | Gillery | 428/432 |
| 4,594,973 | 6/1986 | Allred et al. | 428/627 |
| 4,631,099 | 12/1986 | Ebata et al. | 228/120 |
| 4,720,401 | 1/1988 | Ho et al. | 427/250 |
| 4,732,798 | 3/1988 | Ishida et al. | 428/901 |
| 4,763,828 | 4/1988 | Fukaya et al. | 221/124 |
| 4,770,479 | 9/1988 | Tustison | 428/472 |
| 4,770,953 | 9/1988 | Horiguchi et al. | 428/210 |
| 4,791,017 | 12/1988 | Hofmann et al. | 428/469 |
| 4,824,008 | 4/1989 | Luscz et al. | 228/121 |
| 4,835,061 | 5/1989 | Ohta et al. | 428/469 |
| 4,847,003 | 7/1989 | Palenisamy | 252/514 |
| 4,861,641 | 8/1989 | Foster et al. | 428/901 |
| 4,861,646 | 8/1989 | Barringer et al. | 428/426 |
| 4,882,212 | 11/1989 | Sing Deo et al. | 428/901 |
| 4,892,857 | 1/1990 | Tennent et al. | 428/469 |
| 4,917,963 | 4/1990 | Kittler | 428/901 |
| 5,019,891 | 5/1991 | Onaki et al. | 428/632 |

OTHER PUBLICATIONS

Baker, R. T. K., et al, Journal of Catalysis, 56, 390–406 (1979).

Gillet, E., et al, Journal de chemie physique, 84, No. 2 107–114 (1987).

Gilmer, G. H., et al, Journal of Metals, Jun. 1987, pp. 19–23.

Grabow, M. H., et al, Surface Science 194, 333–346 (1988).

Hoffman, L. C., Ceramic Bulletin, vol. 63, No. 4, 572–576 (1984).

Renou, A., et al, Surface Science 156, 69–84 (1985).

Sands, T., et al, J. Appl. Phys. 62(5), 2070–2078 (Sep. 1, 1987).

Vest, R. W., Ceramic Bulletin, vol. 65, No. 4, 631–636 (1986).

Kennefick, C. M., et al, Acta Metall. vol. 37, No. 11, pp. 2947–2952 (1989).

Choi et al "Interaction between Ti or Ni and $Al_2O_3$ or $Y_2O_3$" High Tech Ceramics (1987).

Primary Examiner—Ellis P. Robinson
Assistant Examiner—Archene A. Turner

[57] ABSTRACT

A continuous thin film metal coated ceramic substrate is provided by employing intimate mixtures of transition element metal and element different from the transition element metal which is from the same group of the Periodic Table as the metallic or semimetallic atom of the ceramic of the substrate.

6 Claims, No Drawings

NON-BEADING, THIN-FILM, METAL-COATED CERAMIC SUBSTRATE

This invention was made at least in part with Government support under Air Force Office of Scientific Research grant number AFOSR-90-0279, Office of Naval Research grant number N00014-88-K-0331, and National Science Foundation grant number DMR 88 18 558A02. The Government has certain rights in the invention.

TECHNICAL FIELD

This invention is directed at ceramic substrates coated with thin films having improved continuity, improved adhesion and improved electrical conductivity properties.

BACKGROUND OF THE INVENTION

Thin film metallization of ceramics is important in at least four technologies. Firstly, in electronic packaging, metal lines are used in multilayer ceramic structures for electrical interconnects. Secondly, very thin metal films supported on ceramic substrates are used as catalysts, for example, in automobile catalytic converters. Thirdly, metal coated ceramic fibers are employed to fabricate metal matrix composites by liquid metal infiltration. Fourthly, devices that employ metal coated active or functional ceramic materials find application in optical, sensor and superconductor technologies.

In all these cases there is a need for providing thin continuous and/or patterned metal films on ceramics. In the case of electronic packaging, metal line density is limited because of the tendency of thin films to become discontinuous. In the case of catalysts, discontinuities in the film lowers efficiency. In the case of metal matrix composites fabricated from fibers, a discontinuous metal coating requires higher infiltration pressure on the liquid metal.

Kennefick, C. M., et al, Acta Metall. Vol. 37, No. 11, pp. 2947-2952 (1989) discuss the problem of the instability of thin metal films when heated to a temperature ranging from 25% of the melting point expressed in degrees Kelvin up to just below the melting point. The instability manifests in the fragmentation of the metal film into islands, hereinafter referred to as beading of the thin film. The same phenomenon is important in all of the applications described above.

The terms "thin metal films" and "thin metal coatings" are used herein to indicate thickness normal to the substrate of at least about 10 nm and less than 10 microns.

SUMMARY OF THE INVENTION

It is an object herein to overcome the beading problem by providing a novel composite composition which does not bead.

This novel composite composition is a ceramic substrate coated with a continuous or patterned film of thickness less than 10 micrometers comprising an intimate mixture of at least one transition element metal and at least one element different from said transition metal element which is from the same group of the Periodic Table of Elements as the metallic or semimetallic atom of the ceramic of the substrate.

The term "substrate" is used herein to mean supporting means or a layer coating on a different supporting means.

The distinction between continuous and patterned films as related to the instant invention is that a continuous film covers a full surface while a patterned film consists of interconnected metal lines.

The term "intimate mixture" is used herein to mean that the said at least one transition element metal and said at least one different element are admixed on an atomic level so as to be homogeneous on a scale of 5 nm.

DETAILED DESCRIPTION OF THE INVENTION

The ceramic substrate can be formed of oxides, nitrides, carbides or borides. Suitable ceramic oxides include, for example, alumina, zirconia, beryllia, silica, magnesia, glasses and glass ceramics, and superconductor oxides, such as yttrium-barium-cuprate and superconducting oxides derived from bismuth, strontium, calcium, and thallium and perovskites, such as PZT, PLZT, PMN, barium titanate, potassium niobate, and lithium niobate. Suitable ceramic nitrides include, for example, silicon nitride, aluminum nitride and titanium nitride. Suitable ceramic carbides include, for example, silicon carbide. Suitable ceramic borides include, for example, titanium boride. The term "metallic or semimetallic atom of the ceramic" means the atom of the ceramic which is not oxygen in the oxides, which is not nitrogen in the nitrides, which is not carbon in the carbides and which is not boron in the borides.

The transition element metal component of the intimate mixture can be, for example, titanium, iron, nickel, copper, palladium, platinum, zirconium, niobium, gold, silver, tungsten or tantalum.

The different element component of the intimate mixture, as indicated above, is one that belongs to the same Periodic Table group as the metallic or semimetallic atom of the ceramic and preferably is the same as the metallic or semimetallic atom of the ceramic. For example, when alumina is the ceramic, said different element can be aluminum or boron, and when zirconia is the ceramic, said different element can be zirconium or titanium. Normally, said different element is selected from the group consisting of metals and semimetals from Groups II, III, IV, VIB and VIII of the Periodic Table, e.g., beryllium, magnesium, calcium, barium, aluminum, scandium, yttrium, cerium, thorium, uranium, silicon, zirconium, titanium, chromium, nickel, cobalt, iron or ruthenium.

The weight percentage of transition element metal in said intimate mixture can vary widely and can be as little as 0.1% or as much as 99.9%, with the remainder being said different element.

The film comprising said intimate mixture preferably has a thickness less than 150 nm. Normally, said film has a thickness of at least 15 nm but films having thickness of 10 nm or less can find application in some instances, e.g., in catalysts.

Turning now to methods for making the coated ceramic substrate herein, these methods preferably involve intimately mixing the constituents forming said intimate mixture. One way of accomplishing this is by premixing said constituents to form an alloy and applying this alloy as a coating by means of sputtering or physical vapor deposition. Yet another way of accomplishing this is to codeposit said constituents by physical vapor deposition on the substrate so that intimate mixing is achieved in situ.

The intimate mixture can be converted to an intermetallic compound and the benefits of the invention are preserved. This 10 conversion is carried out, for example, by heating at 300° to 1200° C. for 5 minutes to 50 hours in air or a reducing atmosphere (e.g., at an oxygen partial pressure ranging from $10^{-1}$ to $10^{-35}$ atmospheres).

The invention is illustrated by the following specific example.

EXAMPLE

Coated ceramic substrates were formed by codepositing aluminum and palladium (50% of each by volume) by electron beam deposition in a vacuum chamber (approximately $10^{-6}$ torr.) on sapphire substrates (5 mm×5 mm×1 mm) to provide a coating of thickness of 120 nm.

In another case, coated ceramic substrates were made the same as above but the film deposited was of palladium only (120 nm thick).

The relative stability, i.e., beading property of the two types of coated substrates, was evaluated by heat treating the coatings at 600° C. and 750° C. in air or in hydrogen having the dew point of liquid nitrogen, for two hours. The beading phenomenon was observed microscopically in a scanning electron microscope and also was characterized by measuring the electrical resistance of the metal coating using the well-known four point contact method.

The microscopic examination showed that the palladium only films beaded into separate islands. These films exhibited a very high electrical resistance that ranged from 16 kiloohms to several megaohms. In contrast, the Pd-Al codeposited films were seen under microscopic examination to have remained continuous and yielded an electrical resistance of less than 25 ohms.

When the Pd:Al volume ratio is varied from 25:1 to 1:25, the same advantage of no beading is derived.

When platinum is substituted for all or part of the palladium, the same advantage of no beading is retained.

When glass or glass ceramic containing alumina and silica is substituted for the sapphire (alumina) in the above test, the same advantage of no beading is retained.

When zirconia is substituted for the sapphire (alumina) and zirconium or titanium is substituted for the aluminum, the same advantage of no beading is retained.

When aluminum nitride is substituted for the sapphire (alumina), the same advantage of no beading is retained.

When barium titanate is substituted for the sapphire (alumina), and titanium or zirconium is substituted for the aluminum, the same advantage of no beading is retained. When in this case, silver is substituted for the palladium, the same advantage of no beading is retained.

When PZT is substituted for the sapphire (alumina), and zirconium or titanium is used in conjunction with either silver or palladium or platinum, the same advantage of no beading is obtained.

When the ceramic substrate is silica and silicon is used in conjunction with nickel or palladium for intimate mixture which is applied to the substrate, the same advantage of no beading is obtained.

Variations will be obvious to those skilled in the art. Thus, the scope of the invention is defined in the claims.

What is claimed is:

1. A non-beading coated ceramic substrate consisting essentially of a ceramic substrate coated with a continuous or patterned thin metal film of thickness normal to the substrate of at least about 10 nm and less than 150 nm, said film consisting of an intimate mixture of at least one transition element metal and at least one element different from said transition element metal, which is from the same group of the Periodic Table of Elements as the metallic or semimetallic atom of the ceramic of the ceramic substrate.

2. The coated ceramic substrate of claim 1 wherein said at least one different element is the same as the metallic or semimetallic atom of said ceramic.

3. The coated ceramic substrate of claim 2 wherein the ceramic substrate is alumina and said at least one different element is aluminum.

4. The coated ceramic substrate of claim 3 wherein the ceramic substrate is alumina and said intimate mixture is formed from palladium and aluminum in a volume ration ranging from 25:1 to 1:25.

5. The coated ceramic substrate of claim 4 wherein said film has a thickness less than 150 nm.

6. The coated ceramic substrate of claim 1 wherein said at least one element different from said transition metal element is selected from the group consisting of metals and semimetals from Groups II, III, IV, VIB and VIII of the Periodic Table of Elements of cerium, thorium and uranium.

* * * * *

UNITED STATES PATENT AND TRADEMARK OFFICE
CERTIFICATE OF CORRECTION

PATENT NO.  : 5,173,354
DATED       : December 22, 1992
INVENTOR(S) : Rishi Raj

It is certified that error appears in the above-identified patent and that said Letters Patent is hereby corrected as shown below:

Claim 4 (column 4, line 38), change "ration" to -- ratio --.

Claim 6 (column 4, line 45), change "of cerium" to -- and cerium --.

Signed and Sealed this

Twelfth Day of October, 1993

Attest:

BRUCE LEHMAN

Attesting Officer          Commissioner of Patents and Trademarks